United States Patent
Chen et al.

(10) Patent No.: US 9,184,154 B2
(45) Date of Patent: Nov. 10, 2015

(54) METHODS FOR FABRICATING INTEGRATED PASSIVE DEVICES ON GLASS SUBSTRATES

(71) Applicant: Taiwan Semiconductor Manufacturing Company, Ltd.

(72) Inventors: Wen-Chao Chen, Tainan (TW);
Ming-Ray Mao, Tainan (TW);
Shih-Hsien Yang, Zhubei (TW);
Kuan-Chi Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/157,287

(22) Filed: Jan. 16, 2014

(65) Prior Publication Data

US 2014/0134801 A1 May 15, 2014

Related U.S. Application Data

(62) Division of application No. 13/013,393, filed on Jan. 25, 2011, now abandoned.

(51) Int. Cl.
*H01L 21/30* (2006.01)
*H01L 21/46* (2006.01)
*H01L 23/00* (2006.01)
*H01G 4/30* (2006.01)
*H01G 4/40* (2006.01)

(52) U.S. Cl.
CPC .............. *H01L 24/97* (2013.01); *H01G 4/30* (2013.01); *H01G 4/306* (2013.01); *H01G 4/40* (2013.01); *H01L 24/11* (2013.01); *H01L 2224/131* (2013.01); *H01L 2224/16238* (2013.01); *H01L 2224/16268* (2013.01); *H01L 2924/15788* (2013.01)

(58) Field of Classification Search
CPC ............ H01L 21/2003; H01L 21/2007; H01L 2224/10
USPC .................. 438/455, 381, 404, 458
See application file for complete search history.

(56) References Cited

U.S. PATENT DOCUMENTS

| | | |
|---|---|---|
| 2009/0140421 A1 | 6/2009 | Lin et al. |
| 2009/0174022 A1 | 7/2009 | Coe-Sullivan et al. |
| 2009/0224391 A1 | 9/2009 | Lin et al. |
| 2009/0230542 A1* | 9/2009 | Lin et al. ............... 257/700 |
| 2010/0140779 A1* | 6/2010 | Lin et al. ............... 257/690 |

* cited by examiner

*Primary Examiner* — Asok K Sarkar
(74) *Attorney, Agent, or Firm* — Slater & Matsil, L.L.P.

(57) ABSTRACT

A method includes forming a plurality of dielectric layers over a semiconductor substrate; and forming integrated passive devices in the plurality of dielectric layers. The semiconductor substrate is then removed from the plurality of dielectric layers. A dielectric substrate is bonded onto the plurality of dielectric layers.

20 Claims, 5 Drawing Sheets

METHODS FOR FABRICATING INTEGRATED PASSIVE DEVICES ON GLASS SUBSTRATES

CROSS-REFERENCE TO RELATED APPLICATIONS

This application is a divisional of U.S. patent application Ser. No. 13/013,393, filed Jan. 25, 2011, which is incorporated herein by reference in its entirety.

BACKGROUND

Integrated passive devices are used in mixed-signal circuits, analog circuits, radio frequency (RF) circuits, dynamic random access memories (DRAMs), embedded DRAM circuits, logic operation circuits, and the like. Integrated passive devices include capacitors, inductors, transformers, resistors, and the like.

The formation of the integrated passive devices may be similar to the processes for forming active devices, wherein starting from a silicon substrate, dielectric layers are formed layer by layer, and metal lines and vias are formed in the dielectric layers. Passive devices are also formed in the dielectric layers.

The conventional integrated passive devices often suffer from low performance that cannot meet the requirement of RF circuits. For example, the Q-factors of the capacitors in the conventional integrated passive devices are low, and the bandwidths of the inductors are narrow. The low performance of the integrated passive devices may be caused by Eddy currents in the respective substrates.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming a device (such as a die) comprising integrated passive devices therein is provided. The intermediate stages of manufacturing an embodiment are illustrated. The variations of the embodiment are discussed. Throughout the various views and illustrative embodiments, like reference numbers are used to designate like elements.

Figure 1:
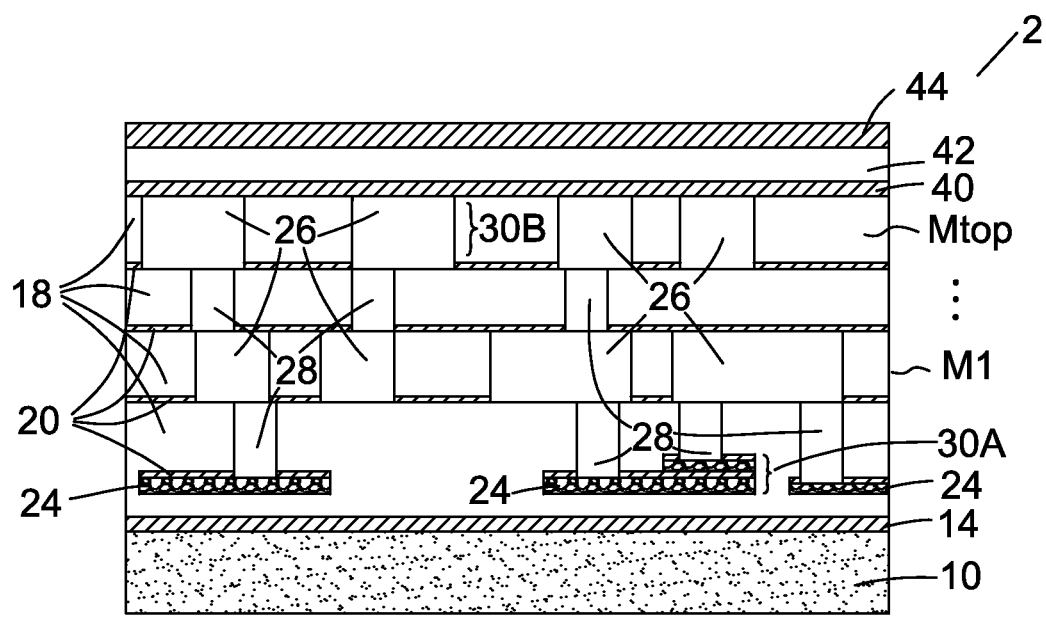
FIGS. 1 through 6 are cross-sectional views of intermediate stages in the manufacturing of a device comprising integrated passive devices in accordance with various embodiments, wherein a glass substrate is bonded to a same side of a semiconductor substrate, on which the integrated passive devices are formed.

FIGS. 1 through 6 illustrate the cross-sectional views of intermediate stages in the manufacturing of a device in accordance with an embodiment, wherein integrated passive devices are formed and are bonded to a dielectric substrate. Referring to FIG. 1, wafer 2 is provided. Wafer 2 includes substrate 10. In an embodiment, substrate 10 is a semiconductor substrate, such as a silicon substrate, although it may include other semiconductor materials, such as silicon carbide, gallium arsenide, or the like.

Dielectric layer 14 is formed over, and may contact, substrate 10. Dielectric layer 14 may be formed of silicon nitride, for example. The thickness of dielectric layer 14 may be between about 2 kÅ and about 10 kÅ, for example. It is realized, however, that the dimensions recited throughout the description are merely examples, and may be changed in alternative embodiments. A plurality of dielectric layers 18 are formed over dielectric layer 14. Dielectric layers 18 may be formed of oxides such as Un-doped Silicate Glass (USG), Fluorinated Silicate Glass (FSG), low-k dielectric materials such as low-k carbon containing oxides, or the like. The low-k dielectric materials may have k values lower than 3.8, although the dielectric materials of dielectric layers 18 may also be close to 3.8. In some embodiments, the k values of the low-k dielectric materials are lower than about 3.0, and may be lower than about 2.5.

Etch stop layers 20 are also formed between dielectric layers 18. In an embodiment, etch stop layers 20 are formed of silicon nitride, although other dielectric materials may be used, providing etch stop layers 20 and dielectric layers 18 have a high etching selectivity.

Metal lines 26 and vias 28 are formed in dielectric layer 18. Metal lines 26 and vias 28 may be formed of substantially pure copper (for example, with a weight percentage of copper being greater than about 90 percent, or greater than about 95 percent) or copper alloys, and may be formed using single and/or dual damascene processes. Metal lines 26 and vias 28 may also be formed of, or may be substantially free from, aluminum. Throughout the description, the term "metal layer" is used to refer to the collection of the metal lines in the same layer. Accordingly, the structure as shown in FIG. 1 includes a plurality of metal layers, namely M1 through Mtop, wherein metal layer M1 is the metal layer closest to substrate 10, while metal layer Mtop is the top metal layer that is farthest away from substrate 10. Although metal layers M2, M3, M4, and the like are not shown in Figures, they may also be formed between metal layers M1 and Mtop. In an embodiment, top metal layer Mtop is an Ultra-Thick Metal (UTM) layer having a thickness greater than about 20 kÅ, for example. The thickness of the UTM layer may also be greater than about 30 kÅ, or greater than about 40 kÅ.

In addition to metal lines 26 and vias 28, integrated passive devices 30 (denoted as 30A and 30B) such as capacitors, inductors, resistors, transformers, baluns, and the like, are also formed in dielectric layers 18. For example, capacitor 30A is schematically illustrated in the form of a Metal-Insulator-Metal (MIM) capacitor, although the capacitors may be other types of capacitors such as Metal-Oxide-Metal (MOM) capacitors. Furthermore, inductor 30B is schematically illustrated, wherein the illustrated portion of inductor 30B represents a cross-sectional view of a portion of the inductor. Integrated passive devices 30 may be formed using a single metal layer or stacked metal layers.

Over top metal layer Mtop, etch stop layer 40, thick oxide layer 42, and thick nitride layer 44 are formed. In an exemplary embodiment, oxide layer 42 has a thickness between about 100 Å and about 10 μm, and nitride layer 44 has a thickness between about 100 Å and about 10 μm. Nitride layer 44 and oxide layer 42 in combination are also referred to as being passivation layer 42/44.

Figure 2:
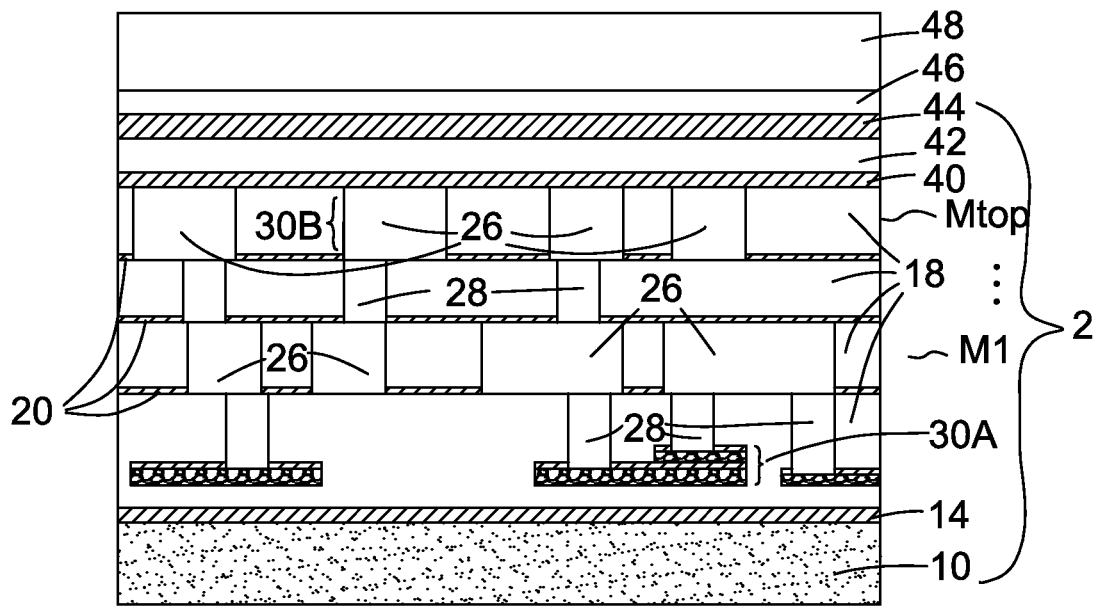
Figure 3:
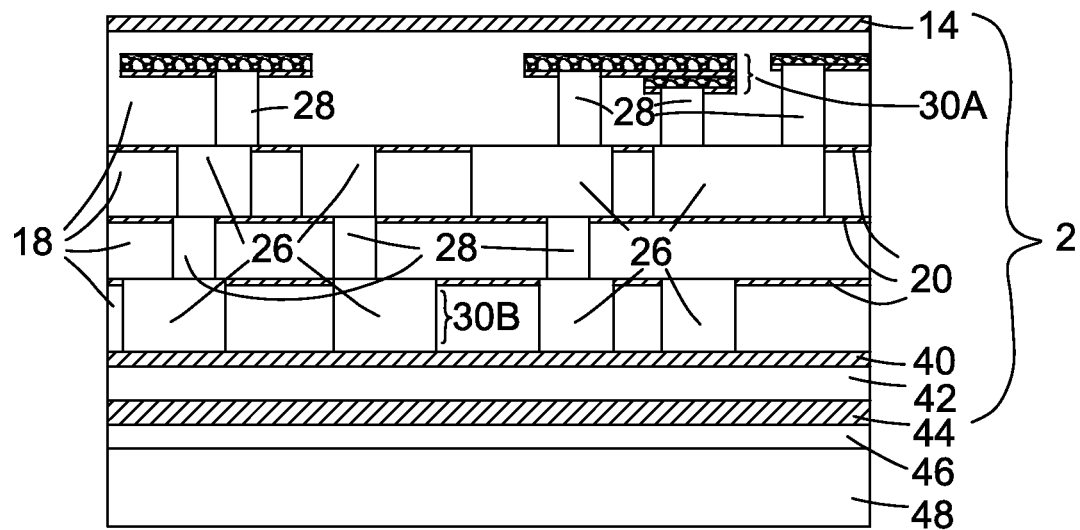

Next, refer to FIG. 2, carrier wafer 48 is bonded to nitride layer 44. In an embodiment, the bonding is performed through adhesive 46, which may be an ultra-violet (UV) glue. Referring to FIG. 3, the structure as shown in FIG. 2 is flipped upside down, and substrate 10 is removed. In an embodiment, substrate 10 is removed using a grinding process or a chemical mechanical polish (CMP) process, wherein dielectric layer 14 may act as the CMP stop layer.

Figure 4:
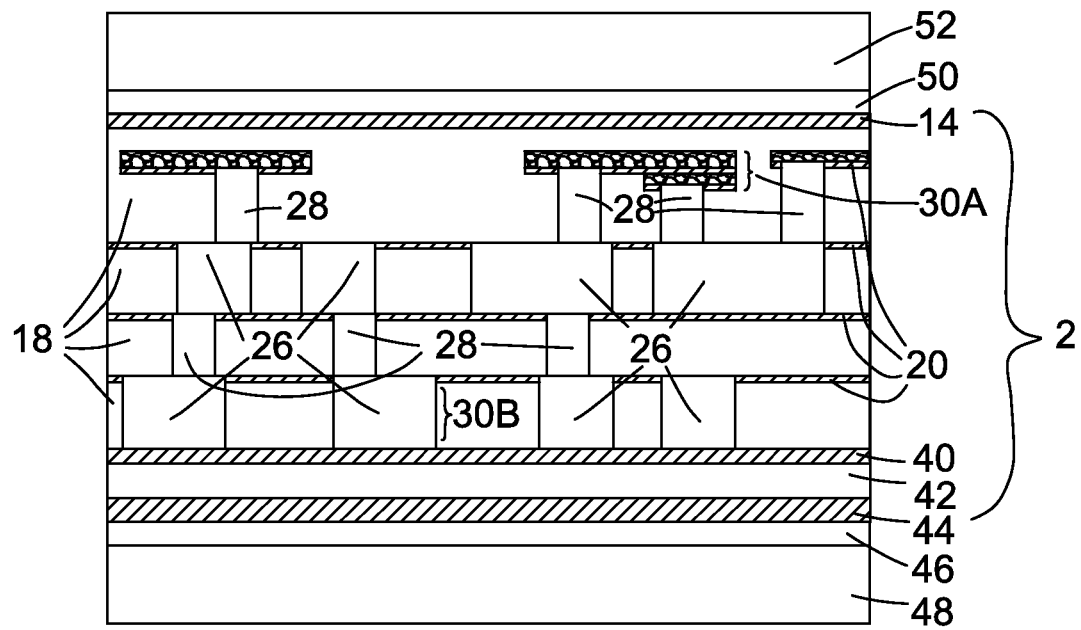

As shown in FIG. 4, dielectric substrate 52 is bonded to dielectric layer 14. In an embodiment, the bonding is performed through adhesive 50. In alternative embodiments, instead of using adhesive 50, dielectric substrate 52 is bonded to dielectric layer 14 through fusion bonding, which is performed at an elevated temperature. Furthermore, in the embodiments wherein the fusion bonding is used, a high pressure may be performed to press dielectric substrate 52 and dielectric layer 14 against each. Dielectric substrate 52 may be a glass substrate, which may be formed of silicate/silica, sapphire, or the like. In alternative embodiments, dielectric substrate 52 may be formed of other known dielectric materials that are suitable for forming dielectric substrates.

Figure 5:
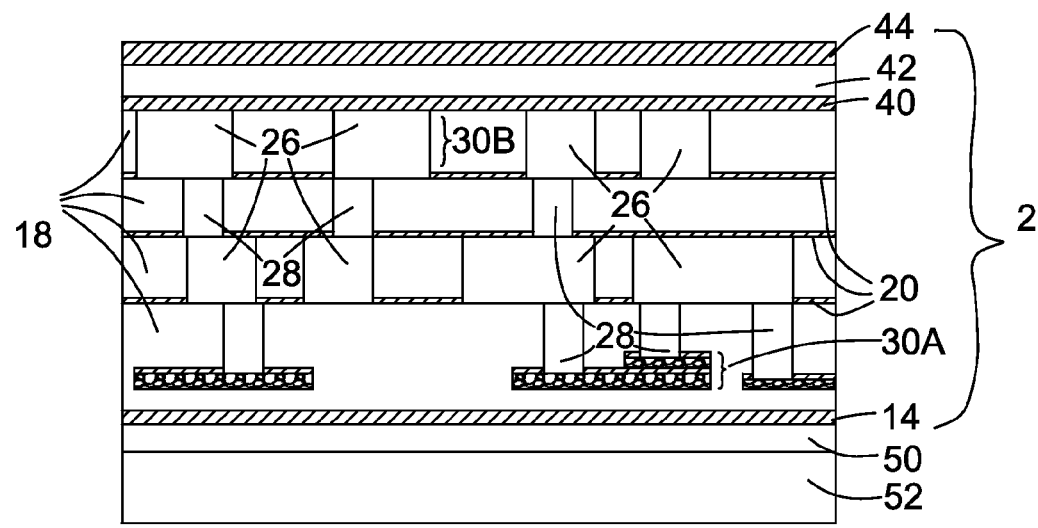
Figure 6:
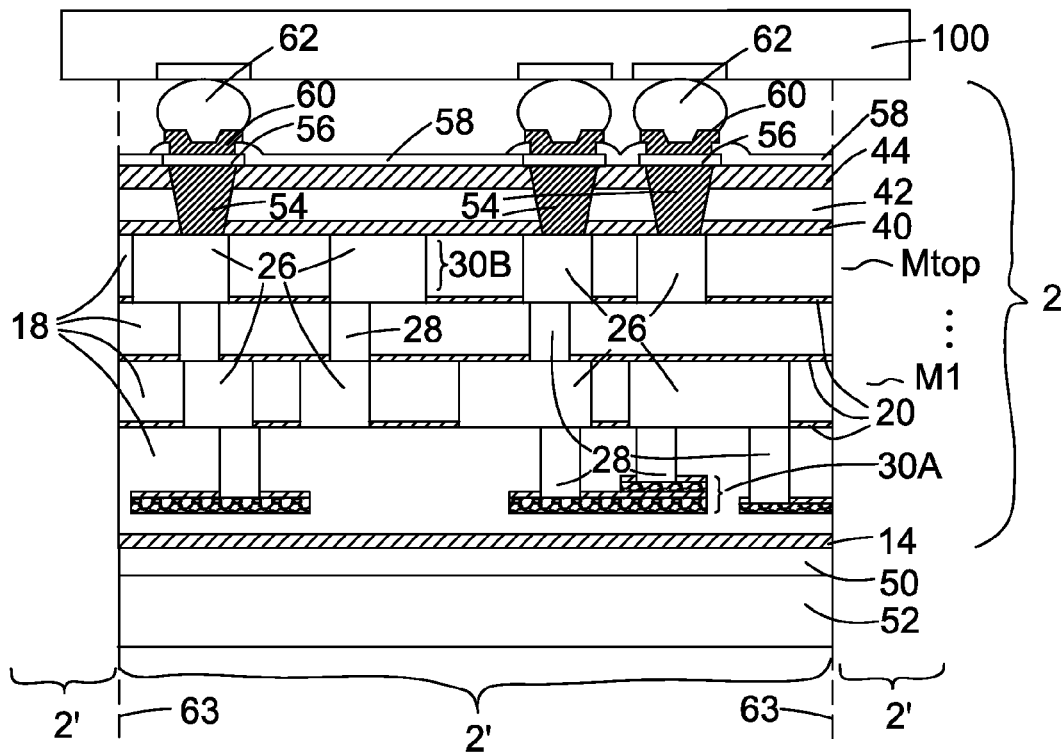

Referring to FIG. 5, the structure as shown in FIG. 4 is again flipped upside down, and carrier wafer 48 is demounted, for example, by exposing UV glue 46 to a UV light. In subsequent steps, bump processes are performed to form bump structures, which are used by external components to access integrated passive devices 30. FIG. 6 illustrates an exemplary resulting structure. The formation process may include forming vias 54 in passivation layer 42/44 and ESL 40, wherein metal vias 54 are electrically connected to metal lines 26 in top metal layer Mtop. Next, metal pads 56 may be formed to connect to metal vias 54. Metal pads 56 may be formed of aluminum or aluminum copper, although other metallic materials such as tungsten, silver, and the like may also be used. Passivation layer 58 is then formed. Passivation layer 58 may be formed of oxides, nitrides, polyimide, and/or the like. Passivation layer 58 may have openings formed therein, through which metal pads 56 are exposed. Underbump metallurgies (UBMs) 60 are then formed to extend into the openings in passivation layer 58 and to contact metal pads 56. Furthermore, metal bumps 62, which may be solder bumps or bumps comprising copper, nickel, palladium, and/or the like, are formed on UBMs 60.

After the formation of metal bumps 62, the structure as shown in FIG. 6 may be sawed, so that the respective wafer is separated into individual dies 2', which are identical to each other. Lines 63 represent the kerf lines on which the die saw is performed. Each of dies 2' includes a piece of dielectric substrate 52, on which integrated passive devices 30 and the respective dielectric layers 18 are located. Dies 2' may then be bonded with other package components (schematically illustrated as 100), which may be a device die including active devices, an interposer, a package substrate, a printed circuit board (PCB), or the like. Accordingly, when integrated passive devices 30 are used, dielectric substrate 52, rather than a semiconductor substrate, is attached to the respective dielectric layers 18, in which integrated passive devices 30 are located.

FIGS. 7 through 10 illustrate the cross-sectional views in the formation of integrated passive devices in accordance with alternative embodiments. In these embodiments, a reversed scheme is used, and the connections to integrated passive devices 30 are formed from the side of metal layer M1 rather than from the side of Mtop. Unless specified otherwise, the reference numerals in these embodiments represent like elements as in the embodiments illustrated in FIGS. 1 through 6. The initial steps of this embodiment are essentially the same as shown in FIG. 1. It is observed that during the formation of the structure in metal layer M1, metal pads 24 are formed. Metal pads 24 may be formed of aluminum, copper, aluminum copper, or the like. In an embodiment, the dielectric layer under metal pads 24 are referred to as being an inter-layer dielectric (ILD, denoted as 22), which may be formed using commonly known ILD materials such as boron phosphor-silicate glass (BPSG). Dielectric layer 22 and dielectric layers 18 may be formed of the same or different dielectric materials.

Figure 7:
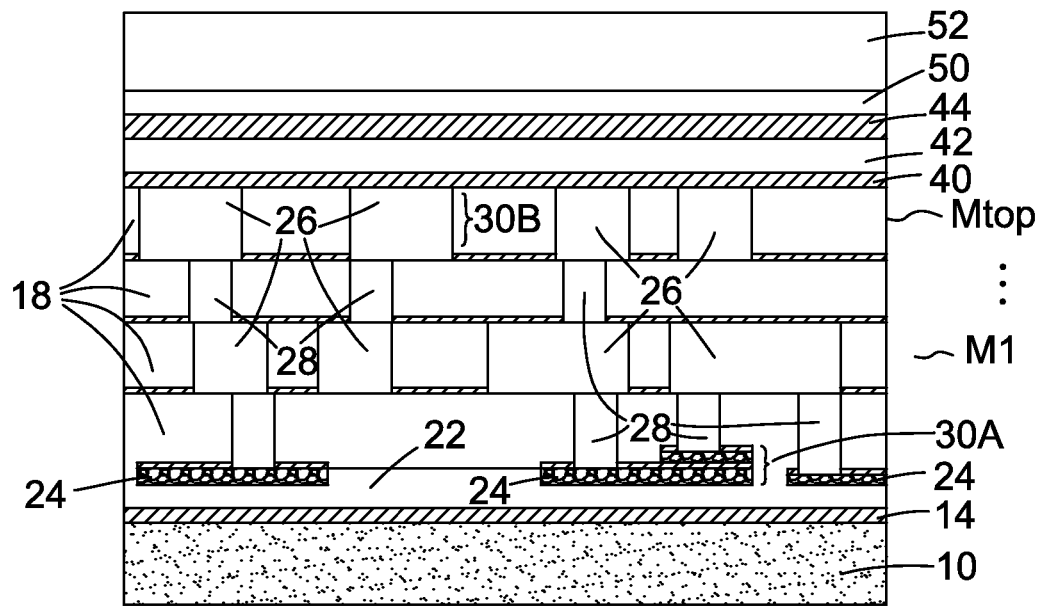
FIGS. 7 through 10 are cross-sectional views of intermediate stages in the manufacturing of a device comprising integrated passive devices in accordance with various alternative embodiments, wherein a glass substrate and a semiconductor substrate, on which the integrated passive devices are formed, are on opposite sides of the integrated passive devices.
Figure 8:
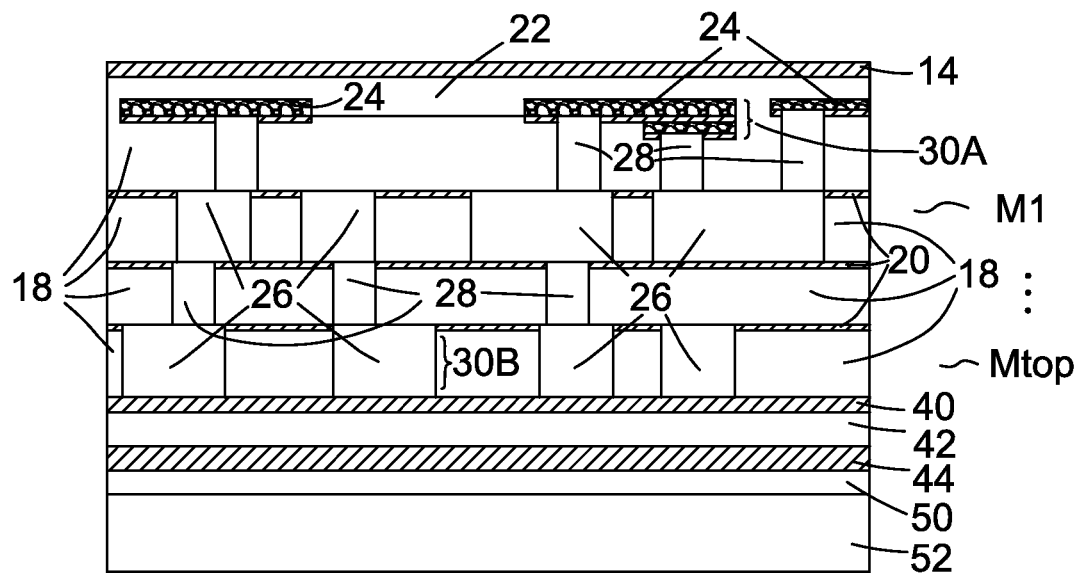
Figure 9:
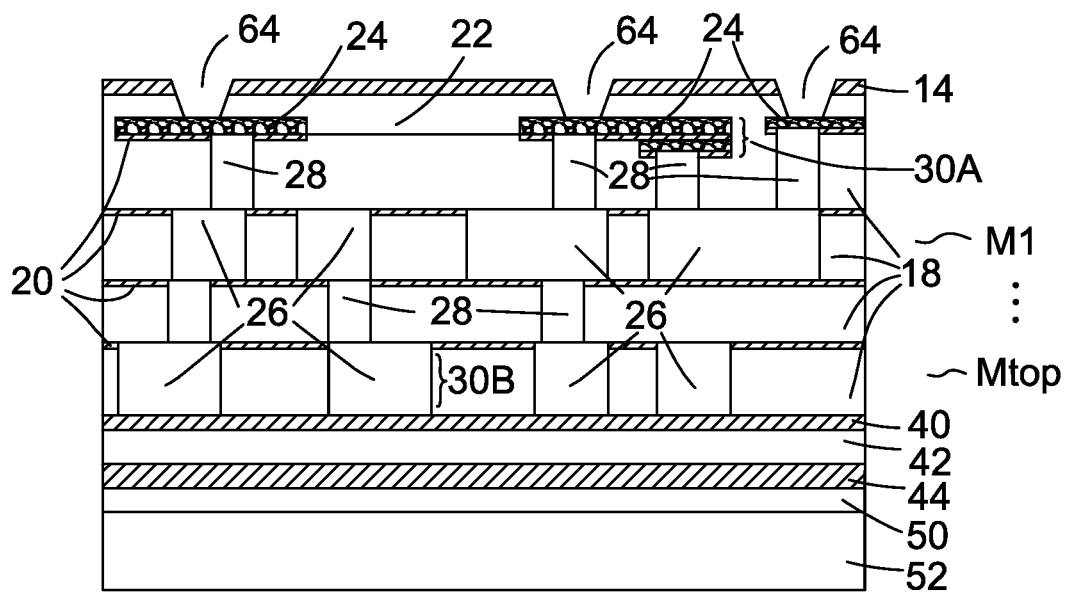

Next, as shown in FIG. 7, dielectric substrate 52 is bonded to dielectric layer 44, wherein the bonding methods and materials may be essentially the same as shown in FIG. 4. Referring to FIG. 8, the structure as shown in FIG. 7 is flipped over, and substrate 10 is removed, for example, using a grinding process or a CMP process. At least a portion of dielectric layer 14 may remain after the removal of substrate 10. In FIG. 9, pad openings 64 are formed, for example, by etching portions of dielectric layer 14 and ILD 22 that are directly over metal pads 24.

Figure 10:
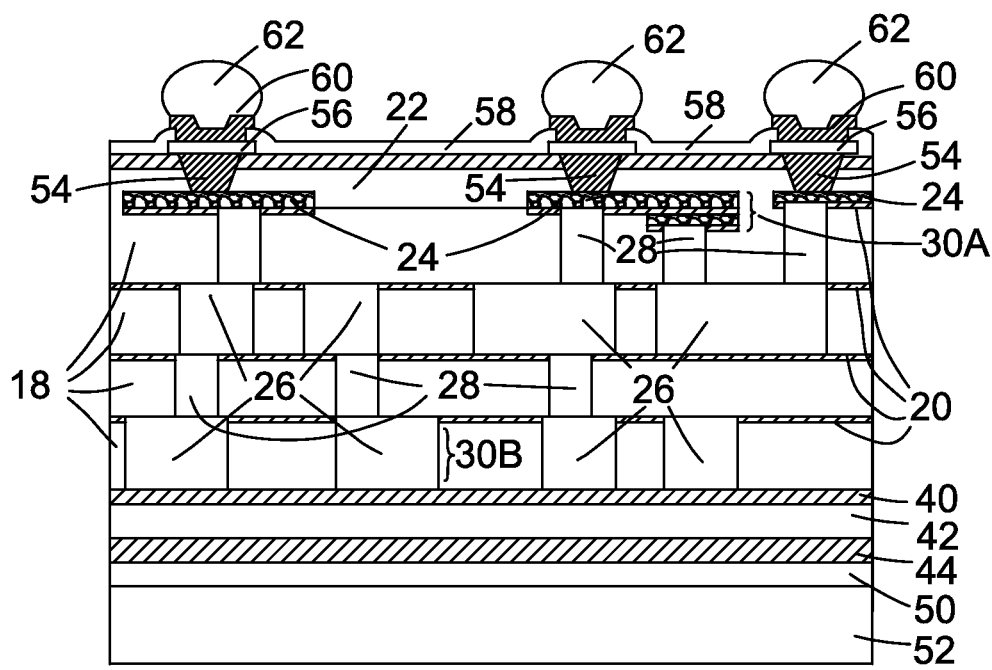

In subsequent process steps, as shown in FIG. 10, metal vias 54, metal pads 56, passivation layer 58, UBMs 60, and metal bumps 62 are formed. It is observed that in the structure as shown in FIG. 10, metal bumps 62 are formed on the same side of dielectric layers 18 as substrate 10 (FIG. 7). In subsequent steps, similar to what is shown in FIG. 6, the structure shown in FIG. 10 may be sawed into individual dies, and the resulting dies may be bonded to package components. Accordingly, each of the resulting packages comprises one piece of dielectric substrate 52.

In the embodiments, as shown in FIG. 1, the formation of passive devices 30, dielectric layers 18, etch stop layers 20 are performed on substrate 10. Since substrate 10, which may be a silicon substrate, has a good thermal conductivity, the formation process is easier than forming the features directly on a glass substrate. On the other hand, at the time integrated passive devices 30 are used, the underlying substrate 52 is a dielectric substrate such as a glass substrate. Accordingly, Eddy currents are substantially eliminated, and the performance of integrated passive devices 30 is improved over the integrated passive devices that are on silicon substrates.

In accordance with embodiments, a method includes forming a plurality of dielectric layers over a semiconductor substrate; and forming integrated passive devices in the plurality of dielectric layers. The semiconductor substrate is then removed from the plurality of dielectric layers. A dielectric substrate is bonded onto the plurality of dielectric layers. The plurality of dielectric layers may be sawed along with the dielectric substrate.

In accordance with other embodiments, a method includes forming a dielectric layer over a semiconductor substrate; forming a plurality of dielectric layers over the dielectric layer; and forming integrated passive devices in the plurality of dielectric layers. A passivation layer is then formed over the plurality of dielectric layers. A carrier wafer is bonded onto the passivation layer. The semiconductor substrate is removed and the dielectric layer is exposed. A glass substrate is bonded onto the dielectric layer. The carrier wafer is then removed from the passivation layer and the plurality of dielectric layers.

In accordance with yet other embodiments, a method includes forming a dielectric layer over a semiconductor substrate; forming a plurality of dielectric layers over the dielectric layer, with integrated passive devices formed in the plurality of dielectric layers; and forming a passivation layer over the plurality of dielectric layers. A glass substrate is bonded onto the passivation layer. The semiconductor substrate is removed. Metal bumps are then formed, wherein the metal bumps and the glass substrate are on located opposite sides of the plurality of dielectric layers.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first dielectric layer on a semiconductor substrate;
   forming circuitry over the semiconductor substrate, the circuitry including at least one contact pad formed in a second dielectric layer, at least one damascene conductor embedded in a third dielectric layer and at least one passive device embedded in a fourth dielectric layer, wherein the second dielectric layer is contacting the first dielectric layer, the third dielectric layer is contacting the second dielectric layer, and the fourth dielectric layer is contacting the third dielectric layer;
   forming a passivation structure over the circuitry;
   bonding a glass substrate onto the passivation structure;
   removing the semiconductor substrate to expose the first dielectric layer;
   patterning the first dielectric layer to form at least one opening therein and to expose at least one contact pad; and
   forming at least one metal bump extending into the at least one opening in the first dielectric layer and electrically contacting the at least one contact pad.

2. The method of claim 1, wherein the semiconductor substrate is a silicon substrate.

3. The method of claim 1, wherein the at least one contact pad contacts the at least one passive device and the at least one passive device contacts the at least one damascene conductor.

4. The method of claim 1, wherein bonding the glass substrate onto the passivation structure comprises fusing bonding the glass substrate to the passivation structure.

5. The method of claim 1, further comprising sawing the glass substrate into a plurality of individual dies.

6. The method of claim 5, further comprising bonding an individual die to one or more package components.

7. The method of claim 1, wherein the step of forming a passivation structure over the circuitry comprises forming a nitride layer.

8. The method of claim 1, wherein the integrated passive device is a capacitor or an inductor.

9. The method of claim 1, wherein the semiconductor substrate is a silicon substrate.

10. A method comprising:
    forming a first dielectric layer on a semiconductor substrate;
    forming circuitry over the semiconductor substrate, the circuitry including at least one contact pad formed in a second dielectric layer, a first passive device embedded in a third dielectric layer and a second passive device embedded in a fourth dielectric layer, wherein the second dielectric layer overlies the first dielectric layer, the third dielectric layer overlies the second dielectric layer, and the fourth dielectric layer overlies the third dielectric layer;
    forming a passivation structure over the circuitry;
    bonding a dielectric substrate onto the passivation structure;
    flipping over the dielectric substrate;
    removing the semiconductor substrate to expose the first dielectric layer;
    patterning the first dielectric layer to form at least one opening therein and to expose at least one contact pad; and
    forming at least one metal bump extending into the at least one opening in the first dielectric layer and electrically contacting the at least one contact pad.

11. The method of claim 10, wherein a k value of each of the first, second, third, and fourth dielectric layers is 3.8 or lower.

12. The method of claim 10, wherein the dielectric substrate is a glass substrate.

13. The method of claim 10, wherein the at least one contact pad contacts the first passive device or the second passive device.

14. The method of claim 10, wherein bonding the dielectric substrate onto the passivation structure comprises fusing bonding the dielectric substrate to the passivation structure.

15. The method of claim 10, wherein the first and second passive devices are selected from a group consisting essentially of capacitors, inductors, and combinations thereof.

16. The method of claim 10, wherein, the semiconductor substrate is a silicon substrate.

17. A method comprising:
    forming a first dielectric layer on a semiconductor substrate;
    forming circuitry over the semiconductor substrate, the circuitry including at least one contact pad formed in a second dielectric layer, at least one damascene conductor embedded in a third dielectric layer and at least one passive device embedded in a fourth dielectric layer, wherein the second and third dielectric layers are separated by a first etch stop layer, and wherein the third and fourth dielectric layers are separated by a second etch stop layer;
    forming one or more passivation layers over the circuitry;
    bonding a dielectric substrate onto the one or more passivation layers;
    removing the semiconductor substrate to expose the first dielectric layer;
    patterning the first dielectric layer to form at least one opening therein and to expose at least one contact pad; and
    forming at least one metal bump extending into the at least one opening in the first dielectric layer and electrically contacting the at least one contact pad.

18. The method of claim 17, wherein the at least one contact pad contacts the at least one passive device and the at least one passive device contacts the at least one damascene conductor.

19. The method of claim 17, wherein bonding the dielectric substrate onto the one or more passivation layers comprises fusing bonding the dielectric substrate to the one or more passivation layers.

20. The method of claim 17, wherein the step of forming one or more passivation layers over the circuitry comprises forming a nitride layer.

* * * * *